(12) United States Patent
Yu et al.

(10) Patent No.: US 6,774,436 B1
(45) Date of Patent: Aug. 10, 2004

(54) SOI MOSFET WITH ASYMMETRICAL SOURCE/BODY AND DRAIN/BODY JUNCTIONS

(75) Inventors: Bin Yu, Cupertino, CA (US); Ralf van Bentum, Radebeul (DE)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/900,400

(22) Filed: Jul. 5, 2001

(51) Int. Cl.$^7$ .................. H01L 31/0392; H01L 21/336
(52) U.S. Cl. .................. 257/347; 257/349; 438/305
(58) Field of Search .................. 257/347, 349, 257/344; 438/305

(56) References Cited

U.S. PATENT DOCUMENTS

| | | | | |
|---|---|---|---|---|
| 4,928,156 A | * | 5/1990 | Alvis et al. | 257/344 |
| 5,245,208 A | * | 9/1993 | Eimori | 257/344 |
| 5,578,865 A | * | 11/1996 | Vu et al. | 257/811 |
| 5,686,735 A | | 11/1997 | Sim | |
| 6,008,099 A | * | 12/1999 | Sultan et al. | 438/305 |
| 6,096,628 A | | 8/2000 | Greenlaw et al. | |
| 6,159,778 A | * | 12/2000 | Kim | 257/E29.064 |

* cited by examiner

Primary Examiner—Amir Zarabian
Assistant Examiner—Kiesha Rose
(74) Attorney, Agent, or Firm—Renner, Otto, Boisselle & Sklar, LLP

(57) ABSTRACT

A semiconductor-on-insulator (SOI) device. The SOi device includes a substrate, an insulator layer disposed on the substrate and an active region disposed on the insulator layer. The active region includes a source, a drain, and a body disposed therebetween. The source and body form an abrupt or hyperabrupt source/body junction. A gate is disposed on the body to operatively form a transistor. An implanted region forms an interface between the body and the drain, the implanted region formed by tilted atom implantation in a direction towards the active region and under the gate from an angle tilted towards the drain with respect to vertical, the implanted region resulting in the formation of a graded drain/body junction. Also disclosed is a method of fabricating the SOI device.

15 Claims, 2 Drawing Sheets

US 6,774,436 B1

SOI MOSFET WITH ASYMMETRICAL SOURCE/BODY AND DRAIN/BODY JUNCTIONS

TECHNICAL FIELD

The present invention relates generally to semiconductor-on-insulator (SOI) devices and methods of forming the same and, more particularly, to SOI devices and methods for forming which avoid or reduce floating body effects and reduce junction capacitance.

BACKGROUND ART

Traditional semiconductor-on-insulator (SOI) integrated circuits typically have a silicon substrate having a buried oxide (BOX) layer disposed thereon. A semiconductor active layer, typically made from silicon, is disposed on the BOX layer. Within the active layer, active devices, such as transistors, are formed in active regions. The size and placement of the active regions are defined by isolation regions. As a result of this arrangement, the active devices are isolated from the substrate by the BOX layer. More specifically, a body region of each SOI transistor does not have body contacts and is therefore "floating."

SOI chips offer potential advantages over bulk chips for the fabrication of high performance integrated circuits for digital circuitry. Such digital circuitry is typically made from partially-depleted metal oxide semiconductor field effect transistors (MOSFETs). In such circuits, dielectric isolation and reduction of parasitic capacitance improve circuit performance, and virtually eliminate latch-up in CMOS circuits. In addition, circuit layout in SOI can be greatly simplified and the packing density greatly increased.

However, devices formed from SOI materials typically exhibit parasitic effects due to the presence of the floating body (i.e., "floating body effects"). These floating body effects may result in undesirable performance in SOI devices. Therefore, it will be appreciated that a need exists for SOI devices having reduced floating body effects. In addition, reducing junction capacitance in SOI devices is also desirable to, in part, increase the switching speed of the device.

SUMMARY OF THE INVENTION

According to one aspect of the invention, the invention is a semiconductor-on-insulator (SOI) device. The SOI device includes a semiconductor substrate layer; an insulator layer disposed on the substrate layer; a semiconductor active region disposed on the insulator layer, the active region including a source, a drain, and a body disposed therebetween, the source and body forming an abrupt or hyperabrupt source/body junction; a gate disposed on the body such that the gate, source, drain and body are operatively arranged to form a transistor; and an implanted region forming an interface between the body and the drain, the implanted region formed by tilted atom implantation in a direction towards the active region and under the gate from an angle tilted towards the drain with respect to vertical, the implanted region resulting in the formation of a graded drain/body junction.

According to another aspect of the invention, the invention is a method of forming a semiconductor-on-insulator (SOI) device. The method includes the steps of providing an SOI wafer having a semiconductor active layer, a semiconductor substrate and a buried insulator layer disposed therebetween; defining an active region in the active layer; forming a source, a drain and a body in the active region, the source and the body forming an abrupt or hyperabrupt source/body junction; forming a gate disposed on the body such that the source, drain, body and gate are operatively arranged to form a transistor; and implanting atoms in a direction towards the active region below the gate at an angle from vertical tilted towards the drain side of the gate, the implanted atoms forming an implanted region resulting in the formation of a graded drain/body junction.

BRIEF DESCRIPTION OF DRAWINGS

These and further features of the present invention will be apparent with reference to the following description and drawings, wherein.

DISCLOSURE OF INVENTION

Figure 1:
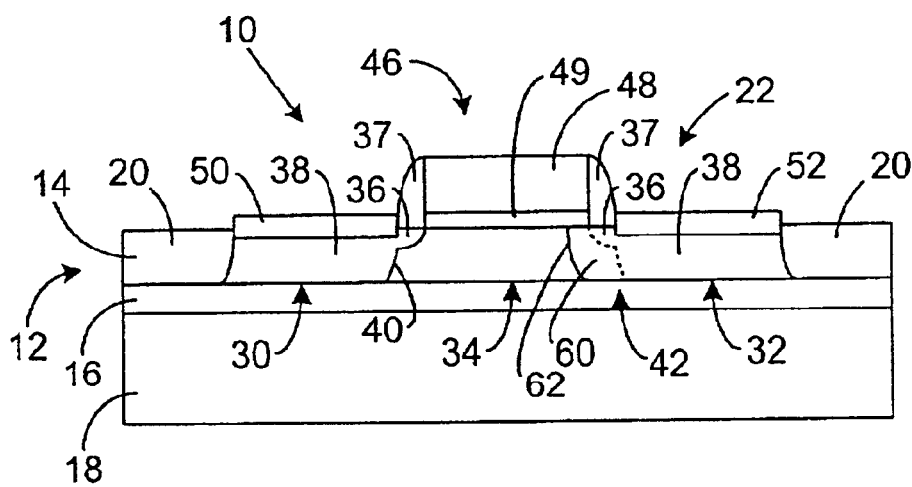
FIG. 1 is a cross-section of a semiconductor-on-insulator (SOI) device according to the present invention.

In the detailed description which follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

Referring initially to FIG. 1, a semiconductor-on-insulator device 10 according to the present invention is shown. In the illustrated embodiment, the device 10 is a transistor, more particularly a partially depleted metal oxide semiconductor field effect transistor (MOSFET). The semiconductor device 10 is fabricated in conjunction with a semiconductor-on-insulator (SOI) wafer 12. The SOI wafer 12 includes an active layer 14 (also referred to as a semiconductor layer 14), a buried insulator layer 16 (also referred to as a buried oxide (BOX) layer 16), and a substrate 18. In one embodiment, the active layer 14 and the substrate 18 are made from silicon, and the BOX layer 16 is made from an oxide, such as silicon oxide or $SiO_2$. The wafer can be formed using techniques such as, for example, direct wafer bonding or a separated by implanted oxygen (SIMOX) technique.

Within the active layer 14, isolation regions 20 define the size and placement of an active region 22 in which the SOI device 10 is fabricated. More specifically, within the active region 22 for the SOI device 10, the SOI device 10 includes a source region 30, a drain region 32, and a body region 34 disposed therebetween. As is further described below, the source and drain regions 30 and 32 include shallow extensions 36 which extend underneath sidewall spacers 37, and deep doped regions 38.

The source region 30 and the drain region 32 have N+ doping and the body region 34 has P doping, making the SOI device 10 an N-channel device. The doping of the source region 30 and drain region 32 is such that the interface between the source region 30 and the body region 34 (i.e., the source/body junction 40) is an abrupt junction or a hyper abrupt junction. The interface between the drain region 32 and the body region 34 (i.e., drain/body junction 42) is a graded junction as described below in more detail. It will be appreciated that, alternatively, the source region 30, the drain region 32 and the body region 34 can have any other appropriate doping. For example, the source region 30 and the drain region 32 can have P+ doping and the body region 34 can have N doping (such an SOI device being a P-channel device). Alternatively, the body region 34 can remain undoped.

The SOI device 10 also has a gate 46 disposed on top of the body region 34. The gate 46 includes a gate electrode portion 48, made from a conductive material such as polysilicon. Disposed between the gate electrode portion 48 and the body region 34 is a gate oxide layer, or gate dielectric 49. The gate dielectric 49 can be formed from a material such as silicon dioxide, silicon oxynitride, silicon nitride ($Si_3N_4$), or the like. Alternatively, other gate stack arrangements, as are known in the art, can be used for the gate 46.

The source and drain regions 30 and 32 include respective source and drain silicide regions 50 and 52 on opposite sides of the gate 46. The gate 46 may include a gate silicide region (not shown), if desired. The silicide regions 50 and 52 may be raised, for example, by epitaxial regrowth, or other methods known in the art. In the illustrated embodiment, the source and drain silicide regions 50 and 52 are substantially symmetric about the gate 46, although it will be appreciated that the silicide regions 50 and 52 may be asymmetrical relative to the gate 46. The silicide regions 50 and 52 have respective uppers surfaces used for establishing external electrical connection using components such as contacts, vias and conductor lines.

The device 10 includes, at the drain region 32 side thereof, a germanium implanted region 60 which is formed by implanting germanium (Ge) in the active region 22 at least partially (extending under the gate 46 about to line 62) below the gate 46. More particularly, as described in greater detail below, the germanium is implanted at an angle from vertical so as to create a graded junction 42 which is less abrupt than the source/body junction 40. In one embodiment, the germanium implanted region 60 is implanted to be partially in the body and partially in the drain, thereby forming an interface between the body and the drain which results in the formation of a graded drain/body junction. Excess germanium may be implanted into the drain region 32 and the source region 30. However, germanium will be shielded from implantation at the source/body junction 40 by the gate 46.

According to the invention, the source/body abrupt junction 40 aids in reducing floating body effects by increasing junction leakage, while the drain/body graded junction 42 (i.e., the less abrupt junction) aids in reducing parasitic junction capacitance. More particularly, the germanium implanted region 60 helps to introduce lattice defects near the drain/body junction 42, making the junction leaky, which reduces floating body effects.

In an alternative embodiment, the implanted germanium 60 can be replaced with implanted xenon (Xe), silicon (Si), krypton (Kr) or argon (Ar). Similar to the germanium, any of these may be used to form the graded junction to reduce parasitic junction capacitance. Accordingly, the germanium implanted region is also referred to herein generically as an implanted region and germanium implantation is also referred to herein generically as atom implantation.

Figure 2:
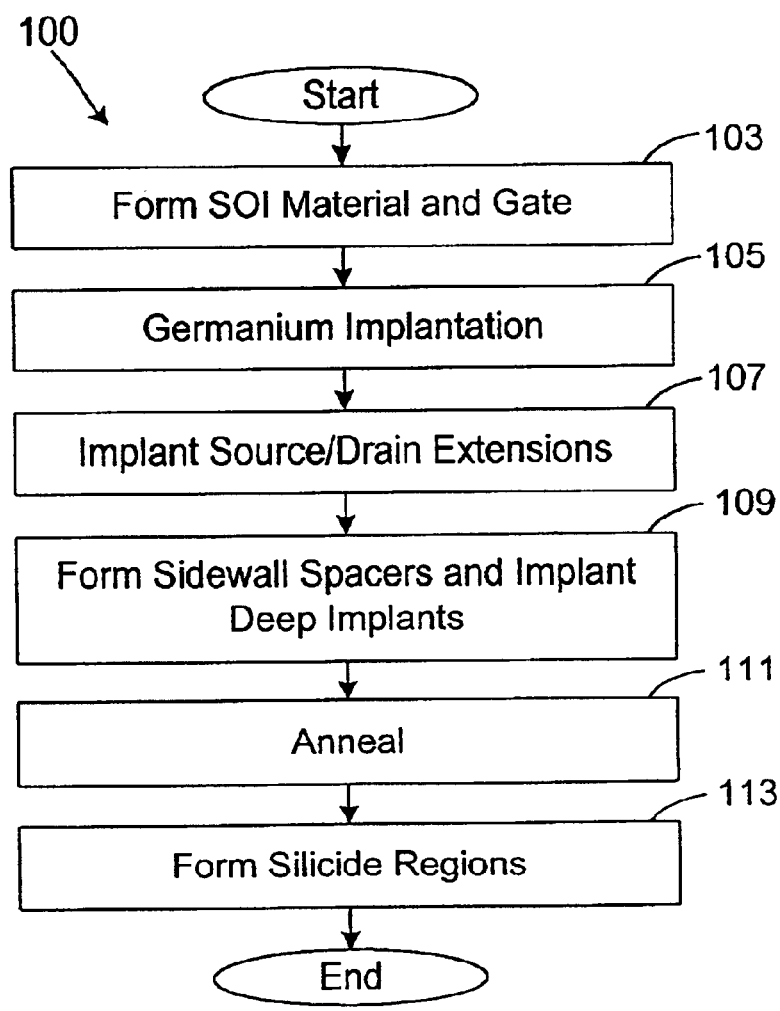
FIG. 2 is a flow chart illustrating a method of fabricating the SOI device of FIG. 1.

Referring now to FIG. 2, a method 100 of fabricating a device 110 in accordance with the present invention is shown in flowchart format. With additional reference to FIG. 3, the method 100 begins in step 103 where a gate 146 is formed on a wafer 112. The wafer 112 has a silicon substrate 118 with a buried oxide (BOX) layer 116 disposed thereon.

Figure 4:
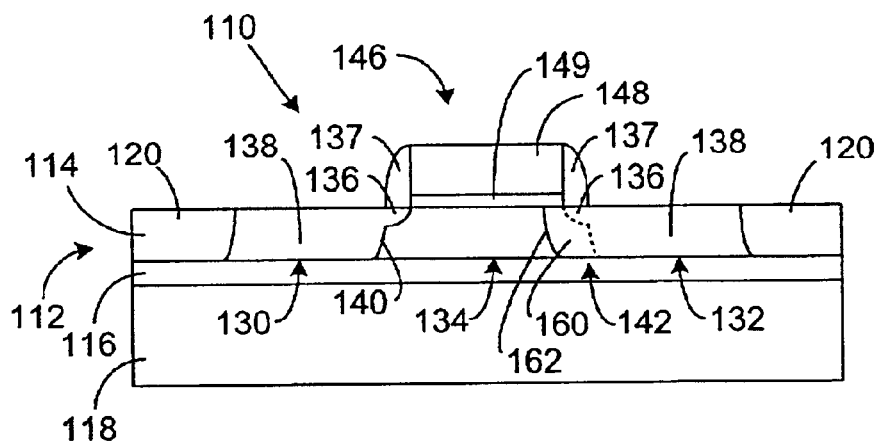
Figure 5:
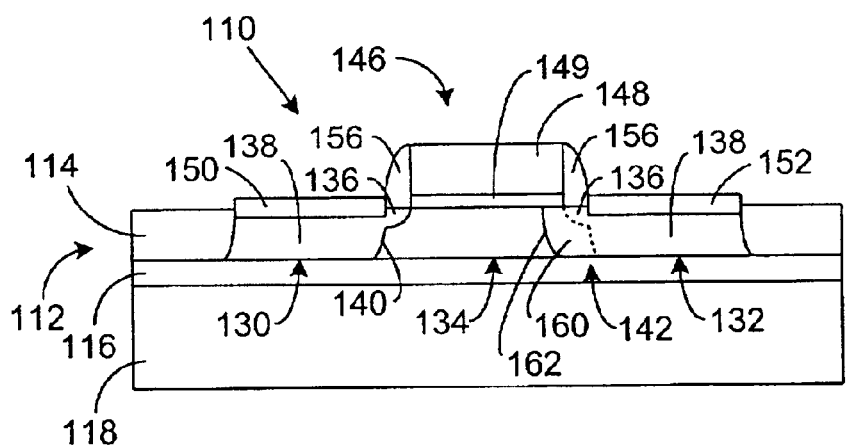

Disposed on the BOX layer 116 is a silicon active layer 114. The active layer 114 may be initially doped for the fabrication of N-channel or P-channel devices. STI regions 120 are formed and define the size and placement of an active region 122. A gate oxide layer 149 is then formed using conventional techniques. A polysilicon gate portion 148, along with any other desired gate layers to form a gate stack, are formed on the gate oxide 149 using conventional techniques. As is further described below, the active region 122 includes a source region 130 on one side of the gate 146, a drain region 132 on the other side of the gate 146, and a body region 134 disposed between the source region 130 and drain region 132 (FIGS. 4 and 5).

Figure 3:
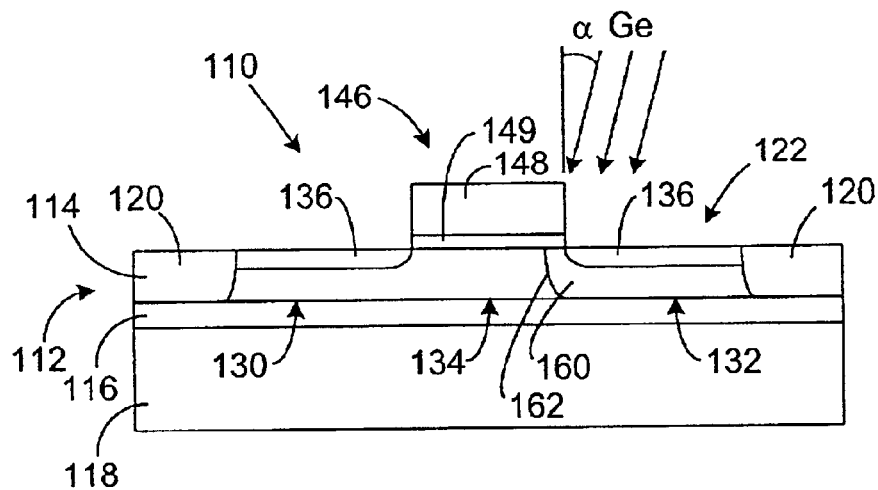
FIGS. 3–5 are cross-sections of the SOI device of FIG. 1 in intermediate stages of fabrication.

In step 105, and with additional reference to FIG. 3, the device 110 is subjected to germanium (Ge) implantation to form a germanium implanted region 160. The germanium is implanted from the drain region 132 side of the gate 146 in a direction towards the active region 122 and under the gate 146 at an angle α of about zero (0) degrees to about 20 degrees from vertical, tilted towards the drain region 132 side of the device 110. As a result, germanium is implanted at least partially under the gate 146 on the drain region 132 side of the device 110 being fabricated. The extent of germanium implantation under the gate 146 is illustrated by line 162. Line 162 will move and change shape depending on factors including angle of implantation, dosage, implantation energy, germanium diffusion, subsequent annealing and the like. It is noted that germanium may not be confined to the germanium implanted region 160, but may also be implanted into areas of the drain region 132 distal to the body region 134 and the source region 130. However, the gate 146 will substantially shield, or block, germanium implantation at the source/body junction 140 (see FIGS. 4 and 5), to be described in greater detail below. The germanium implantation energy range is about 10 keV to about 40 keV, with a dose of about $1 \times 10^{14}$ atoms/cm$^2$ to about $1 \times 10^{15}$ atoms/cm$^2$. The resultant dopant concentration in the germanium implanted region is about $1 \times 10^{20}$ atoms/cm$^3$.

After germanium implantation, the wafer 112 can be annealed. Alternatively, annealing can be deferred until after a deep dopant implantation step (see below). After annealing, the germanium implanted region 160 extends laterally in an upper portion of the active region 122 (i.e., after formation in the body region 134 and in the extension 136, respectively under the gate 146 and the spacer 137) for about five to about 10 nanometers (nm). The germanium implanted region 160 extends laterally in a lower portion of the active region 122 for about five to about 10 nm.

As indicated above, it will be appreciated that xenon (Xe), silicon (Si), krypton (Kr) or argon (Ar) atoms can be used as an alternative to germanium.

Next, in step 107, and still referring to FIG. 3, source and drain extensions 136 are implanted. For an N-channel device, N-type extensions 136 are formed by implanting arsenic (As) at, for example, an energy of about 1.0 keV to about 5.0 keV. For a P-channel device, P-type extensions 136 are formed by implanting boron fluoride ($BF_2$) at, for example, an energy of about 1.0 keV to about 5.0 keV. Regardless of the channel type, the implantation dose for the extensions 136 is, for example, about $1 \times 10^{14}$ atoms/cm$^2$ to about $1 \times 10^{15}$ atoms/cm$^2$.

As one skilled in the art will appreciate, the formation of the source/drain extensions 136 can be carried out using alternative dopants (e.g., phosphorus (P), nitrogen (N), antimony (Sb), or bismuth (Bi) for N-type doping, or gallium (Ga), Indium (In) or Thallium (Tl) for P-type doping) and/or at other appropriate energy levels and dose levels, as is desirable for the device being fabricated.

Next, in step 109, and as illustrated in FIG. 4, side wall spacers 137 are formed adjacent the gate 146. The spacers 137 are formed using conventional techniques and are made from a material such as silicon oxide ($SiO_2$) or a nitride (e.g., $Si_3Na_4$). Deep source/drain implants 138 are then implanted. For an N-channel device, N-type deep implantation is made by implanting arsenic (As) at, for example, an energy of about 10 keV to about 50 keV and a dose of about $1 \times 10^{15}$ atoms/cm$^2$ to about $5 \times 10^{15}$ atoms/cm$^2$. For a P-channel device, P-type deep implantation is made by implanting boron fluoride ($BF_2$) at, for example, an energy of about 10 keV to about 50 keV and a dose of about $1 \times 10^{15}$ atoms/cm$^2$ to about $5 \times 10^{15}$ atoms/cm$^2$. As noted above with respect to the source/drain extensions 136, the formation of the deep source/drain implants 138 can be carried out using alternative dopants and/or at other appropriate energy levels and dose levels, as is desirable for the device being fabricated.

Thereafter, in step 111, the wafer 112 is subjected to a thermal anneal cycle, such as a rapid temperature anneal (RTA). In an exemplary RTA, the wafer 112 is subjected to a thermal anneal cycle at about 1,000° C. to about 1,150° C. for a period of about 0.1 seconds to about 15 seconds.

It will be appreciated that the deep source/drain implants 138 may alternatively be formed before the above step of germanium implantation (i.e., step 105). Also, as an alternative to the foregoing deep doping technique, the deep doped source and drain regions 138 can be formed using a solid phase epitaxy (SPE) process. More specifically, SPE is used to amorphize the semiconductor layer 114 with ion species, such as, silicon or germanium. The energy and dosage of the ion species can be determined empirically for the device being fabricated. An exemplary energy range for SPE is about 10 KeV to about 40 KeV and an exemplary dosage is about $1 \times 10^{14}$ atoms/cm$^2$ to about $5 \times 10^{14}$ atoms/cm$^2$. Next, as part of the SPE doping process, dopant is implanted to achieve the desired N-type or P-type doping and then the semiconductor layer 114 is recrystalized using a low temperature anneal. An exemplary low temperature anneal is about 500° C. to about 700° C. for a period of about 30 minutes to about five hours.

The deep implant step 109 forms an abrupt or hyperabrupt source/body junction 140. However, due to the presence of germanium on the drain region 132 side of the device 110 being formed, the dopant implanted during step 109 does not form such an abrupt junction. The germanium implant 160 overlaps with the drain/body junction 142 formed by deep implantation, thus forming a graded drain/body junction 142. As is further described below, the resulting drain/body graded junction 142 has a relatively low junction capacitance.

Next, in step 113, and as illustrated in FIG. 5, a source silicide region 150 and a drain silicide region 152 are formed on opposite sides of the gate 146. A gate silicide region (not shown) may be formed, if desired, in the gate 146. Silicide formation is initiated by depositing a layer of metal upon the spacers 156, the gate 146 and the exposed portions of the semiconductor layer 114. The metal layer may be formed by sputtering, chemical vapor deposition (CVPD), or evaporation. The metal of the metal layer may be a metal such as titanium, cobalt, nickel, or tungsten which is suitable for reacting with the semiconductor material to form silicide.

The resulting source/body junction 140 removes charges in the body region 134, thereby reducing floating body effects (FBE) in the device 110. In other words, the source/body junction 140 of the device 110 is a leaky junction which aids in removing accumulated charges from the body. The graded junction 162, which is less abrupt than the source/body junction 140, aids in reducing parasitic junction capacitance.

Although particular embodiments of the invention have been described in detail, it is understood that the invention is not limited correspondingly in scope, but includes all changes, modifications and equivalents coming within the spirit and terms of the claims appended hereto.

For example, the germanium implantation step 105 can be carried out before the extension formation step 107 to control the abruptness of the drain/body junction in the area formed by the extension.

In another embodiment, the germanium implantation step 105 can be carried out after spacer 137 formation and/or after deep implantation to control drain/body junction formation.

In another embodiment, a disposable spacer can be formed before germanium implantation to control placement of the germanium implanted region 160. Following germanium implantation, the disposable spacer can be removed.

What is claimed is:

1. A semiconductor-on-insulator (SOI) device comprising:

a semiconductor substrate layer;

an insulator layer disposed on the substrate layer;

a semiconductor active region disposed directly on the insulator layer, the active region including a source, a drain, and a body disposed therebetween, the source and body forming an abrupt or hyperabrupt source/body junction;

a gate disposed on the body such that the gate, source, drain and body are operatively arranged to form a transistor; and an implanted region at an interface between the body and the drain, the implanted region providing a graded drain/body junction that is disposed at least partially under the gate, wherein the abrupt or hyperabrupt source/body junction does not include an implanted region similar to the implanted region at the interface between the body and the drain.

2. The SOI device according to claim 1, wherein the implanted region is disposed partially in the body below a portion of the gate adjacent the drain and is disposed partially in the drain thereby extending laterally across at least a portion of the drain/body junction.

3. The SOI device according to claim 1, wherein the implanted atoms introduce lattice defects near the drain/body junction.

4. The SOI device according to claim 3, wherein the atoms are selected from germanium, xenon, silicon, argon and krypton.

5. The SOI device according to claim 1, wherein atoms implanted to form the implanted region are absent from a region surrounding the source/body junction.

6. The SOI device according to claim 5, wherein the atoms are absorbed by the gate when the atoms are implanted at an angle tilted towards the drain with respect to the vertical, the angle is about 0 to about 20 degrees from vertical.

7. The SOI device according to claim 5, wherein the atoms are selected from germanium, xenon, silicon, argon and krypton.

8. The SOI device according to claim 7, wherein the implanted atoms are germanium at a dose of about $1\times10^{14}$ atoms/cm$^2$ to about $1\times10^{15}$ atoms/cm$^2$.

9. The SOI device according to claim 8, wherein the implanted germanium atoms are implanted at an energy of about 10 keV to about 40 keV.

10. The SOI device according to claim 7, wherein the implanted atoms are germanium at an energy of about 10 keV to about 40 keV.

11. The SOI device according to claim 7, wherein the implanted atoms are germanium and result in a dopant concentration of about $1\times10^{20}$ atoms/cm$^3$ in the implanted region.

12. The SOI device according to claim 1, wherein the source includes a source extension region and a main source region.

13. The SOI device according to claim 12, wherein the abrupt or hyperabrupt source/body junction extends along a source extension junction and a main source junction and the body.

14. The SOI device according to claim 12, wherein the drain includes a drain extension region and a main drain region.

15. The SOI device according to claim 14, wherein the graded drain/body junction extends along a drain extension junction and a main drain junction and the body.

* * * * *